United States Patent [19]

Schinzel

[11] Patent Number: 5,666,075
[45] Date of Patent: Sep. 9, 1997

[54] ELECTRONIC CIRCUIT COMPRISING A COMPARATOR

[75] Inventor: Peter Schinzel, Boeblingen, Germany

[73] Assignee: Hewlett-Packard Company, Palo Alto, Calif.

[21] Appl. No.: 623,437

[22] Filed: Mar. 28, 1996

[30] Foreign Application Priority Data

Apr. 13, 1995 [EP] European Pat. Off. ............ 95105675
May 12, 1995 [EP] European Pat. Off. ............ 95107236

[51] Int. Cl.⁶ .................................................. H03K 5/22
[52] U.S. Cl. ........................... 327/77; 327/78; 327/88; 327/205
[58] Field of Search ........................ 327/77, 78, 79, 327/88, 89, 560–563, 307, 362, 334, 355, 74, 205, 374, 361, 50

[56] References Cited

U.S. PATENT DOCUMENTS

| | | | |
|---|---|---|---|
| 3,679,982 | 7/1972 | Limberg | 327/77 |
| 3,890,575 | 6/1975 | Tawfik | 327/77 |
| 4,384,219 | 5/1983 | Davis | 307/362 |
| 5,068,552 | 11/1991 | Itou et al. | 327/563 |
| 5,126,683 | 6/1992 | Ishikawa et al. | 327/50 |
| 5,166,550 | 11/1992 | Matsubara et al. | 307/356 |
| 5,264,740 | 11/1993 | Wright | 307/355 |
| 5,319,265 | 6/1994 | Lim | 327/77 |

FOREIGN PATENT DOCUMENTS

| | | |
|---|---|---|
| 0936 | 4/1990 | European Pat. Off. |
| 19 48 603 | 5/1977 | Germany |
| 109 969 | 5/1982 | Japan |

*Primary Examiner*—Toan Tran

[57] ABSTRACT

This invention relates to the operation of common electronic comparators and particularly to an electronic circuit with a comparator for the operational test of integrated circuits (ICs). According to the invention, the electronic circuit comprises a common comparator with an input, an output and a reference input. To the reference input a constant reference voltage is applied. The input voltage to be compared with the reference voltage is superimposed to a time-dependent signal and the resulting voltage is applied to the input of the comparator.

20 Claims, 4 Drawing Sheets

ELECTRONIC CIRCUIT COMPRISING A COMPARATOR

FIELD OF THE INVENTION

The present invention relates to the operation of common electronic comparators and particularly to an electronic circuit with a comparator for operational test of integrated circuits (ICs).

BACKGROUND OF THE INVENTION

A common electronic comparator (such as an operational amplifier) has two inputs and one output. To the first input a signal to be compared is applied and to the second input a reference voltage is applied. If the voltage of the signal to be compared exceeds the reference voltage, the voltage level of the output of the comparator changes its state from a low voltage level to a high voltage level or vice versa, depending on the comparator type.

The reference voltage is a DC voltage adjusted to a specific voltage level. Most comparators have a hysteresis, i.e. an input voltage to be compared with the reference voltage will not be detected as being larger or smaller than the reference voltage, if the signal to be compared lies within the hysteresis area around the reference voltage.

Furthermore, every electronic comparator has a delay, i.e. a time shift between the time when the signal to be compared is applied to the first input of the comparator and the time when the comparator generates an output signal depending on the result of the comparison of the input and the reference voltage. The delay depends on the specific overdrive, i.e. the voltage difference between the reference voltage and the input voltage to be compared, before the input voltage to be compared changes its state from a voltage level below the reference voltage to a level above the reference voltage or vice versa. The larger the overdrive the shorter the delay and vice versa.

Thus there is a need for an electronic circuit comprising a comparator with a small hysteresis and a delay being stabilized and constant for different signals to be compared with a reference voltage.

SUMMARY OF THE INVENTION

The present invention relates to an arrangement for the operational test of ICs and an electronic circuit comprising a comparator.

Basically, an electronic circuit according to the invention comprises:

a comparator with an input, an output and a reference input;

a first signal source generating a constant voltage being applied to said reference input as a reference voltage;

a second signal source generating a time-dependent voltage; and an adder adding an input voltage and said time-dependent voltage, generating a time-dependent voltage being applied to said input of said comparator, or a comparator with an input, an output and a reference input;

a first signal source generating a constant voltage;

a second signal source generating a time-dependent voltage;

an adder adding said constant voltage and said time-dependent voltage, generating a time-dependent voltage being applied to said reference input of said comparator.

According to the invention, the voltage difference between the reference input and the input of the comparator is made time-dependent. A time-dependent voltage is superimposed either to an input voltage to be compared or to a constant reference voltage being applied to the comparator. Preferably, the time-dependent voltage is a strong increasing and falling periodic signal, such as a square wave signal. If the voltage level of the time-dependent voltage is periodical and exceeds the reference voltage significantly, the time delay of the comparator is nearly independent from the input signal to be compared. Furthermore, the delay of the comparator is very short as the larger the overdrive, the shorter the delay. In case that the input voltage lies within the hysteresis voltage area of the comparator, by superimposing of the time-dependent signal to the input voltage, one can achieve that the transfer characteristic of the comparator does not or nearly does not comprise a hysteresis area as described below in greater detail.

It will be understood that instead of superimposing the input voltage to be compared or the reference voltage with the time-dependent voltage, one can apply periodically the input voltage to the input of the comparator in a first time interval and apply the time-dependent voltage to the input of the comparator in a second time interval without applying the other at the same time. The same switching can be carried out with regard to a reference voltage and the time-dependent voltage being applied to the reference input of the comparator.

According to a first embodiment of the invention the time-dependent voltage comprises a first and a second voltage level. The difference between both levels is chosen to be at least as large as the hysteresis voltage area around the reference voltage of said comparator. If an increasing input voltage reaches the bottom line of the hysteresis voltage area and the time-dependent voltage is superimposed to the input voltage, the voltage obtained has a level above the top line of the hysteresis voltage area. The output of the comparator switches from a first state to a second state and remains at the second state even if the time-dependent voltage falls to its lower voltage level. If an input signal lying above the top line of the hysteresis voltage area of the comparator decreases and enters the top line of the hysteresis voltage area, the comparator output will remain in its second state until the further decreasing input signal reaches the bottom line of the hysteresis area (in case that the time-dependent voltage is on its low level, i.e. a zero-voltage-level).

The transmission characteristic of the comparator does not or nearly does not comprise a hysteresis area.

According to a second embodiment of the invention the time-dependent voltage is a periodic square-wave signal with an increasing and falling signal flank which can be easily generated by common square-wave generators.

According to a third embodiment of the invention the output of the comparator is applied to the input of a sampler while the time-dependent signal is applied to the clock input of the sampler. A signal flank of the time-dependent signal can be used to trigger the sampler.

If a time-delay circuit is connected between the time-dependent signal and the clock input of the sampler, the time-delay circuit is preferably adjusted that the sampler samples shortly after the signal flank.

In a fourth embodiment of the invention an arrangement with several of the described circuits is used. Each comparator has a different reference voltage level and the signal to be compared is applied to each input of the comparators. The reference voltage level increases stepwise from one comparator to the next and from the minimum to the maximum expected voltage level of the input signal. Thus the arrangement according to the invention operates like an analog-to-digital converter and allows to determine the signal to be compared very precisely. This is of particular interest when analyzing the behavior of integrated circuits (ICs) under test.

It is understood and expressly noted that the present invention relates to all useful and novel combinations of the above disclosed features, whether alone or in any other arbitrary combination. Furthermore, all cited advantages can be seen as objects solved by the invention in its entirety.

BRIEF DESCRIPTION OF THE DRAWINGS

For better understanding of the present invention, together with other and further objects, advantages and capabilities thereof, reference is made to the accompanying drawings, which are incorporated herein by reference and in which.

DETAILED DESCRIPTION OF PREFERRED EMBODIMENTS

Figure 1:
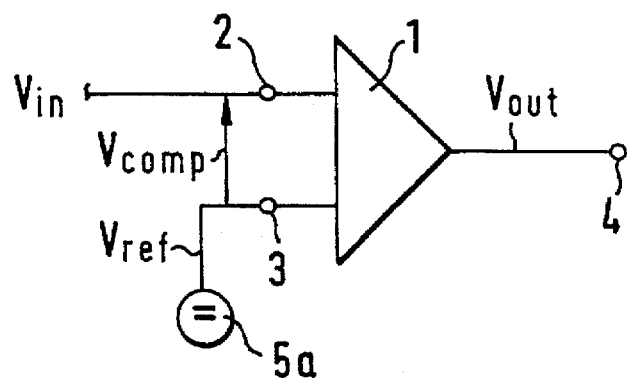
FIG. 1 depicts a block diagram of an electronic circuit with a comparator and a D.C. reference voltage source according to prior art.

FIG. 1 shows a common comparator 1 with an input 2, an output 4 and a reference input 3. The input voltage $V_{in}$ to be compared with a reference voltage $V_{ref}$ is applied to the input 2 and the reference voltage $V_{ref}$ is applied to the reference input 3. The reference voltage $V_{ref}$ is generated by a D.C. signal source 5a. The voltage difference between $V_{in}$ and $V_{ref}$ is indicated by $V_{comp}$.

Figure 2:
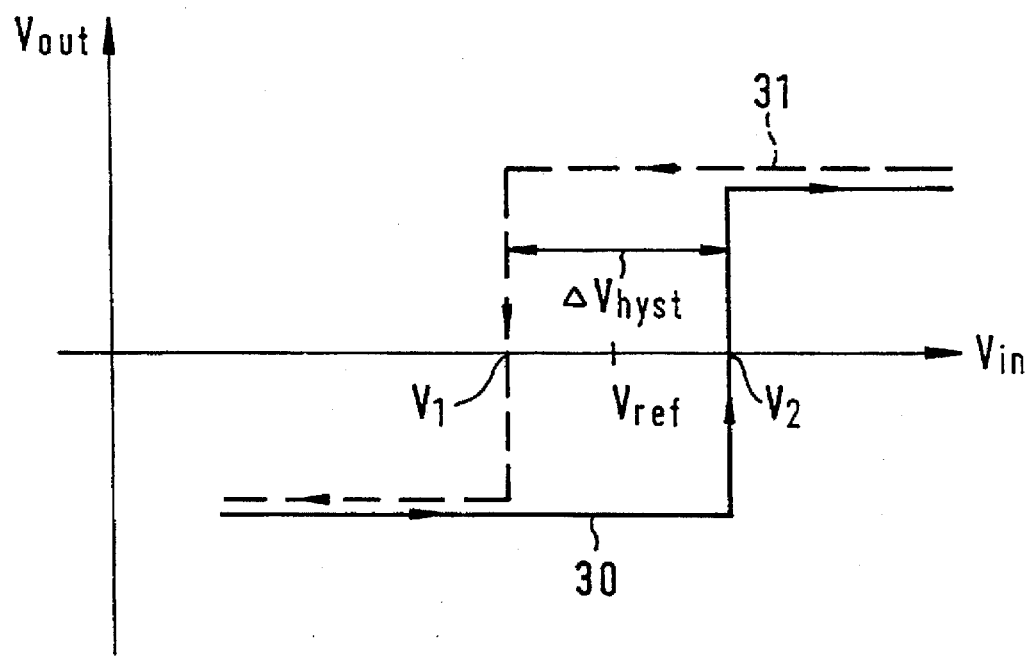
FIG. 2 shows the transfer characteristic (output voltage versus input voltage) of the comparator in FIG. 1.

FIG. 2 shows the transfer characteristic of the comparator in FIG. 1 (output voltage versus input voltage of the comparator). Additionally, FIG. 2 shows the reference voltage $V_{ref}$ and a hysteresis voltage area $\Delta V_{hyst}$ of the comparator 1 around the reference voltage $V_{ref}$.

An input signal 30 is applied to the input 2 of the comparator 1 in FIG. 1. When the voltage of the input signal 30 reaches the top line of the hysteresis voltage area, lying above the reference voltage $V_{ref}$ at the input voltage $V_2$, the output voltage of the comparator 1 changes its state to a high voltage level. When an input signal 31 with a decreasing voltage reaches the bottom line of the hysteresis voltage area of the comparator 1, at a voltage $V_1$, lying below the reference voltage $V_{ref}$ the output voltage of the comparator 1 switches from its high level voltage to its low level voltage. The voltage area between $V_1$ and $V_2$ is the hysteresis voltage area $\Delta V_{hyst}$.

Figure 3A:
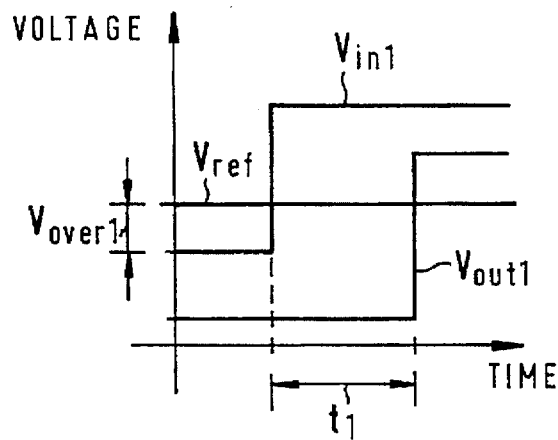
FIG. 3a is a diagram showing a delay between an input signal and the corresponding output signal of the comparator in FIG. 1 for a first overdrive voltage.
Figure 3B:
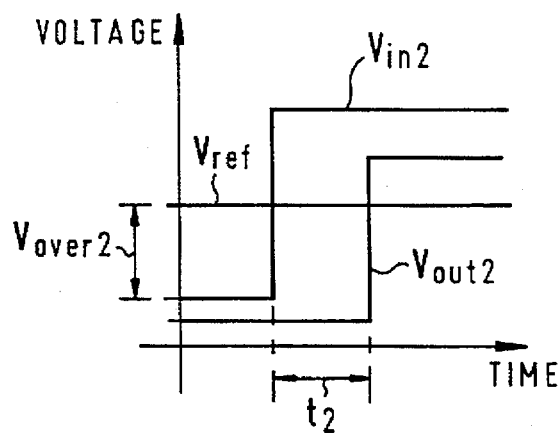
FIG. 3b is a diagram showing a delay for a second overdrive voltage being larger than the first overdrive voltage.

FIG. 3a and 3b are diagrams of voltage versus time each showing the same reference voltage $V_{ref}$ different input voltages $V_{in1}$, $V_{in2}$ and corresponding output voltages $V_{out1}$, $V_{out2}$ of the comparator 1. By comparison of FIG. 3a and 3b it will be seen that the delay $t_2$ in FIG. 3b is shorter than the delay $t_1$ in FIG. 3a, corresponding to a larger overdrive voltage $V_{over2}$ in FIG. 3b with regard to the overdrive voltage $V_{over1}$ in FIG. 3a. The voltage difference between a reference voltage $V_{ref}$ and an input voltage $V_{in}$ is called overdrive voltage.

Figure 4:
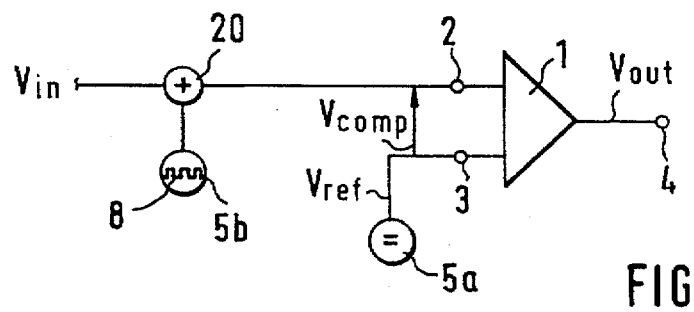
FIG. 4 shows an electronic circuit according to the invention with a comparator, an adder adding an input signal and a time-dependent signal; the resulting signal is applied to the input of the comparator of FIG. 1.

FIG. 4 shows a comparator 1 with an input 2, a reference input 3 and an output 4. The reference input 3 is connected with a first signal source 5a generating a constant voltage $V_{ref}$. The input 2 of the comparator 1 is connected with a common adder, such as an integrating operational amplifier, which adds the input voltage $V_{in}$ to be compared with the reference voltage and a periodic square-wave signal generated by a second signal source 5b.

Figure 5A:
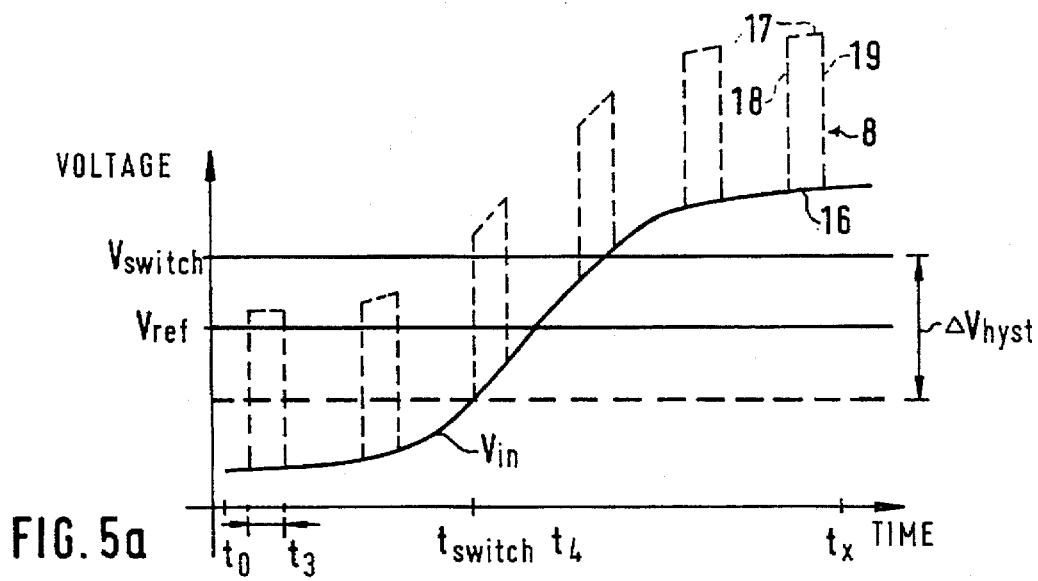
FIG. 5a is a diagram voltage versus time with an input signal, a time-dependent signal being added to the input signal, a reference voltage and the hysteresis area of the comparator of FIG. 1.

FIG. 5a is a diagram voltage versus time for an example of an input signal with a time-dependent input voltage $V_{in}$ being added with a periodic square-wave signal 8. Furthermore, the diagram shows a constant reference voltage $V_{ref}$ and the voltage hysteresis area $\Delta V_{hyst}$ around the reference voltage of the comparator 1.

Figure 5B:
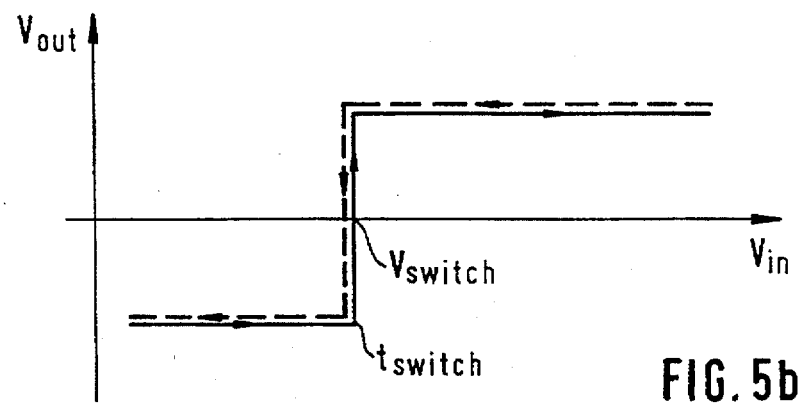
FIG. 5b shows the transfer characteristic (output voltage versus input voltage) of the comparator of FIG. 4.

From $t_o$ to $t_{switch}$ the voltage $V_{in}$ of the input signal increases slowly and lies below the bottom line (dashed line in FIG. 5a) of the hysteresis voltage area. The periodic square-wave signal 8 is added to the time-dependent input signal to be compared. At $t_{switch}$ the input voltage is added to an increasing flank 18 of the periodic square-wave signal and the resulting voltage exceeds the top-line of the hysteresis voltage area $\Delta V_{hyst}$. From FIG. 5b showing output voltage $V_{out}$ versus input voltage $V_{in}$ of the comparator 1 it will be seen that at $t_{switch}$ and $V_{switch}$ the comparator 1 changes its state and the output voltage of the comparator increases from its low level to its high level. The periodic square-wave signal 8 comprises a signal breadth $t_3$. After the time $t_{switch}+t_3$ the periodic square-wave signal 8 has a zero voltage level, such as at $t_4$. From $t_{switch}$ to $t_x$ the input voltage $V_{in}$ still increases.

At $t_4$ the voltage of the input signal lies within the hysteresis voltage area $\Delta V_{hyst}$ and the common comparator 1 still remains in its high level state up to the time $t_x$.

From the dashed line in FIG. 5b it will be seen that the output voltage of the common comparator 1 switches from its high level state to its low level state at $t_{switch}$ and $V_{switch}$ if the input signal is the same as described before but being a descending signal starting at $t_x$.

By comparison of FIG. 2 (prior art) and FIG. 5b it will be seen that the hysteresis voltage area $\Delta V_{hyst}$ does not or nearly does not exist when the electronic circuit according to the invention is used.

It should be noted that the time-dependent additional input voltage generated by the second signal source 5b may be chosen to have a significantly larger voltage difference between first voltage level 16 and second voltage level 17 than shown in FIG. 5a. The larger the overdrive, i.e. the voltage difference of the added input signal of the comparator 1 and its reference voltage, the smaller the delay-dependency. The same applies to delay-dependency of different slow rates of the input signal to be compared. Preferably, the voltage difference between the first voltage level 16 and the second voltage level 17 of the time-dependent voltage 8 is at least as large as the hysteresis voltage area $\Delta V_{hyst}$. This ensures that there is no or nearly no hysteresis voltage area in the transfer characteristic of the common comparator 1 as shown in FIG. 5b. It will be understood that a time-dependent additional input voltage having a higher frequency than that shown in FIG. 5a can be chosen to improve the transfer characteristic.

Figure 6:
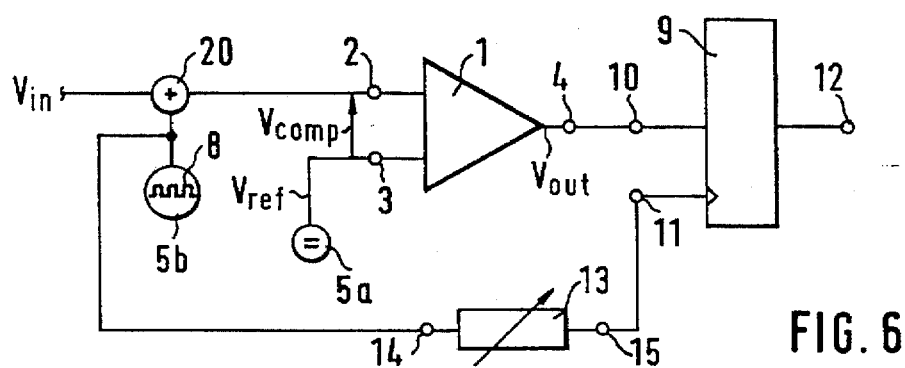
FIG. 6 is a block diagram of the electronic circuit of FIG. 4 comprising additionally a time-delay circuit and a sampling circuit.

FIG. 6 shows the electronic circuit of FIG. 4 and additionally a time-delay circuit 13 and a sampler 9, such as an edge-triggered flip-flop. The sampler input 10 of the sampler 9 is connected with the output 4 of the comparator 1. The clock input 11 of the sampler 9 is connected with the output 15 of the time-delay circuit 13. The input 14 of the time-delay circuit 13 is connected with the second signal source 5b generating a time-dependent additional input voltage, such as a periodic square-wave signal 8. The output of the sampler 9 is designated with 12.

The sampler 9 is triggered by first signal flank 18 of the periodic square-wave signal 8. It will be understood that also the second signal flank 19 could be used to trigger the sampler 9. The time-delay circuit 13 is adjusted to a time-delay that the sampler samples after the first or second signal flank. The breadth of the square-wave signal 8, is indicated by $t_3$. Preferably, the time-delay is adjusted to a time-delay $t_3$+the decay time of the square-wave signal to ensure that only the input voltage $V_{in}$ to be compared with the reference voltage $V_{ref}$ is sampled. The common sampler 9 detects whether the output voltage $V_{out}$ of the comparator 1 is low or high when the triggering signal flank reaches the clock input of the sampler 9. Depending on whether the output signal $V_{out}$ of the comparator 1 is low or high, the sampler output 12 changes its voltage level.

If the second signal flank 19 is used to trigger the sampler 9, the time-delay of the time-delay circuit 13 has to be chosen accordingly.

It will be understood that the electronic circuit shown in FIG. 6 may comprise further time-delay circuits, such as a further time-delay circuit to delay the input voltage of the electronic circuit.

Figure 7:
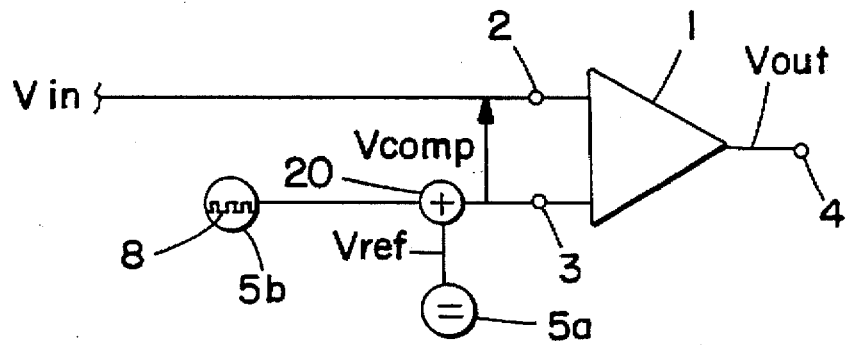
FIG. 7 shows a further embodiment of the invention.
Figure 8:
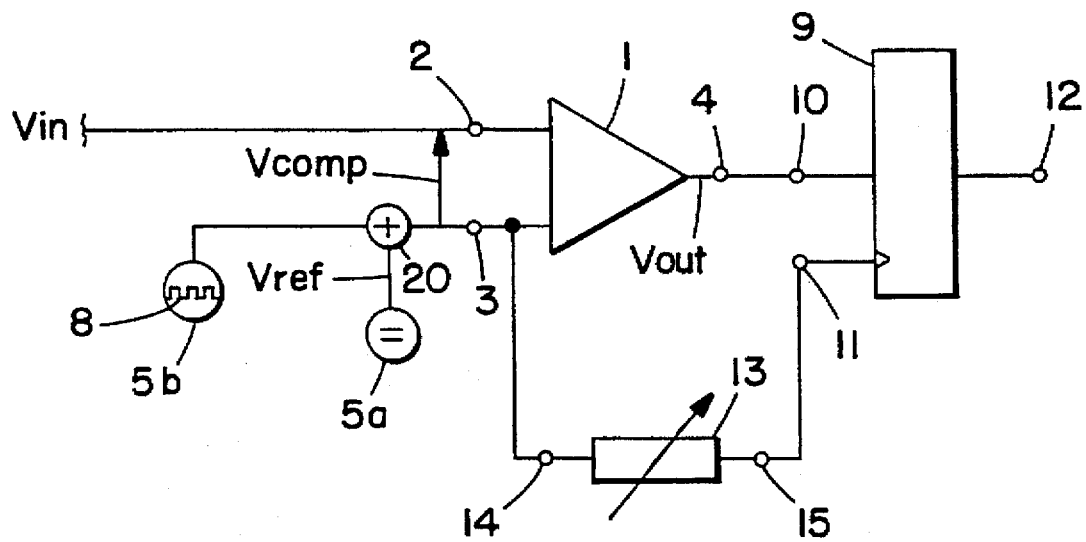
FIG. 8 is a block diagram of the electronic circuit of FIG. 7, comprising additionally a time-delay circuit and a sampling circuit.

FIG. 7 shows another embodiment of the invention wherein a periodic square wave signal 8 is added to the constant reference voltage $V_{ref}$ and the resultant signal is applied to reference input 3 of comparator 1. FIG. 8 shows the electronic circuit of FIG. 7 and additionally a time delay circuit 13 and a sampler 9.

I claim:

1. An electronic circuit comprising:
   a comparator with an input, an output and a reference input;
   a first signal source for applying a constant voltage to said reference input as a reference voltage;
   a second signal source for generating a time-dependent voltage;
   an adder adding an input voltage and said time-dependent voltage to generate a time-dependent voltage for application to said input of said comparator.

2. An electronic circuit comprising:
   a comparator with an input, an output and a reference input;
   a first signal source for generating a constant voltage;
   a second signal source for generating a time-dependent voltage;
   an adder for adding said constant voltage and said time-dependent voltage to generate a time-dependent voltage for application to said reference input of said comparator.

3. The electronic circuit as defined in claim 1, wherein said time-dependent voltage comprises a first and a second voltage level and the difference between said first and second voltage level being at least as large as a hysteresis voltage area of said comparator.

4. The electronic circuit as defined in claim 1, wherein said second signal source generates a time-dependent voltage with a signal flank.

5. The electronic circuit as defined in claim 1, wherein said time-dependent voltage is a periodic signal.

6. The electronic circuit as defined in claim 1, wherein said time-dependent voltage is a square-wave signal.

7. The electronic circuit as defined in claim 1, further comprising:
   a sampler with a sampler input, a clock input and a sampler output;
   said sampler input connected with said output of said comparator, and said clock input connected with said second signal source generating said time-dependent voltage;
   wherein, said time-dependent voltage triggers said sampler.

8. The electronic circuit as defined in claim 7, wherein a signal flank of said time-dependent voltage triggers said sampler.

9. The electronic circuit as defined in claim 8, wherein a positive signal flank and/or negative signal flank of said time-dependent voltage triggers said sampler.

10. The electronic circuit as defined in claim 7, further comprising;
    a time-delay circuit, with an input and an output, wherein said input is connected with an output of said second signal source generating said time dependent voltage, and said output is connected with said clock input of said sampler.

11. The electronic circuit as defined in claim 10, wherein said time-delay circuit comprises a time delay that the sampler samples after a first or second signal flank.

12. The electronic circuit as defined in claim 2, wherein said time-dependent voltage comprises a first and a second voltage level and the difference between said first and second voltage level being at least as large as a hysteresis voltage area of said comparator.

13. The electronic circuit as defined in claim 2, wherein said second signal source generates a time-dependent voltage with a signal flank.

14. The electronic circuit as defined in claim 2, wherein said time-dependent voltage is a periodic signal.

15. The electronic circuit as defined in claim 2, wherein said time-dependent voltage is a square-wave signal.

16. The electronic circuit as defined in claim 2, further comprising:

a sampler with a sampler input, a clock input and a sampler output;

said sampler input connected with said output of said comparator, and said clock input connected with said second signal source generating said time-dependent voltage;

wherein, said time-dependent voltage triggers said sampler.

17. The electronic circuit as defined in claim 16, wherein a signal flank of said time-dependent voltage triggers said sampler.

18. The electronic circuit as defined in claim 17, wherein a positive signal flank and/or negative signal flank of said time-dependent voltage triggers said sampler.

19. The electronic circuit as defined in claim 16, further comprising;

a time-delay circuit, with an input and an output, wherein said input is connected with an output of said second signal source generating said time dependent voltage, and said output is connected with said clock input of said sampler.

20. The electronic circuit as defined in claim 19, wherein said time-delay circuit comprises a time delay that the sampler samples after a first or second signal flank.

* * * * *